United States Patent
Yan et al.

(10) Patent No.: US 9,508,693 B2
(45) Date of Patent: Nov. 29, 2016

(54) SEMICONDUCTOR DEVICE WITH HEAT SINKS

(71) Applicant: NXP B.V., Eindhoven (NL)

(72) Inventors: Liang Yan, St. Joris Weert (BE); Roel Daamen, Herkenbosch (NL); Anco Heringa, Waalre (NL); Erwin Hijzen, Leuven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/500,840

(22) Filed: Sep. 29, 2014

(65) Prior Publication Data

US 2015/0123200 A1    May 7, 2015

(30) Foreign Application Priority Data

Nov. 6, 2013    (EP) .................................. 13191736

(51) Int. Cl.
| | |
|---|---|
| *H01L 25/07* | (2006.01) |
| *H01L 23/367* | (2006.01) |
| *H01L 27/02* | (2006.01) |
| *H01L 29/78* | (2006.01) |
| *H01L 27/12* | (2006.01) |
| *H01L 29/06* | (2006.01) |

(52) U.S. Cl.
CPC ......... *H01L 25/072* (2013.01); *H01L 23/3677* (2013.01); *H01L 27/0211* (2013.01); *H01L 27/1203* (2013.01); *H01L 29/0696* (2013.01); *H01L 29/7824* (2013.01); *H01L 29/0653* (2013.01); *H01L 2924/0002* (2013.01)

(58) Field of Classification Search
CPC ............... H01L 27/1203; H01L 21/84; H01L 29/66772; H01L 25/072; H01L 29/0696; H01L 27/0211; H01L 23/3677; H01L 29/7824; H01L 29/0653; H01L 2924/0002
See application file for complete search history.

(56) References Cited

U.S. PATENT DOCUMENTS

| | | | |
|---|---|---|---|
| 5,616,950 A | 4/1997 | Liu | |
| 6,121,661 A | 9/2000 | Assaderaghi et al. | |
| 2002/0130409 A1 | 9/2002 | Oue et al. | |
| 2003/0062622 A1 | 4/2003 | Pavier et al. | |
| 2003/0150596 A1* | 8/2003 | Chen ................... | H01L 23/3672 165/80.3 |
| 2006/0189028 A1* | 8/2006 | Yoon ............................ | 438/106 |

(Continued)

FOREIGN PATENT DOCUMENTS

| | | |
|---|---|---|
| DE | 10 2004 004 221 A1 | 8/2005 |
| EP | 2 139 036 A1 | 12/2009 |

(Continued)

OTHER PUBLICATIONS http://www.efunda.com/materials/elements/TC_Table.cfm?Element_ID=Al efunda materials reference for the thermal conductivity of aluminum at various temperatures.*

Yan, L. et al. "Integrated Heat Sinks for SOI Power Devices", 25th Intl. Symp. on Power Semiconductor Devices and ICs, pp. 285-288 (May 2013).

(Continued)

*Primary Examiner* — John P Dulka
*Assistant Examiner* — Charles R Peters (57) ABSTRACT

An integrated heat sink array is introduced in SOI power devices having multiple unit cells, which can be used to reduce the temperature rise in obtaining more uniform temperature peaks for all the unit cells across the device area, so that the hot spot which is prone to breakdown can be avoided, thus the safe operating area of the device can be improved. Also the array sacrifice less area of the device, therefore results in low Rdson.

15 Claims, 6 Drawing Sheets

(56) References Cited

U.S. PATENT DOCUMENTS

| | | |
|---|---|---|
| 2006/0192253 A1 | 8/2006 | Okumura et al. |
| 2011/0108979 A1 | 5/2011 | Nakagawa et al. |
| 2011/0121450 A1 | 5/2011 | Tsukada et al. |
| 2013/0270606 A1* | 10/2013 | Chen et al. .................. 257/183 |
| 2015/0084128 A1* | 3/2015 | Gambino et al. ............. 257/347 |

FOREIGN PATENT DOCUMENTS

| | | |
|---|---|---|
| EP | 2 395 548 A1 | 12/2011 |
| JP | 6-283874 A | 7/1994 |
| JP | 2005-175074 A | 6/2005 |
| JP | 2007-115894 A | 5/2007 |
| JP | 2008-140831 A | 6/2008 |
| JP | 2009-064852 A | 3/2009 |
| JP | 2011-44619 A | 3/2011 |

OTHER PUBLICATIONS

Wessels, P. et al. "Advanced BCD Techonology for Automotive, Audio and Power applications", Solid State Electronics, vol. 51, No. 2, pp. 195-211 (2007).

Krabbenborg, B.H. "Robustness of LDMOS Power Transistors in SOI-BCD Processes and Derivation of Design Rules Using Thermal Simulation", Prod. of 13th Intl. Symp. on Power Semiconductor Devices and ICs, pp. 157-160 (2001).

Lee, T., "Design Optimization of an Integrated Liquid-Cooled IGBT Power Module Using CFD Technique", IEEE Trans. on Components and Packaging Technologies, vol. 23, No. 1, pp. 55-58 (Mar. 2000).

Extended European Search Report for EP Patent Appln. No. 13191736.1 (Apr. 14, 2014).

* cited by examiner

SEMICONDUCTOR DEVICE WITH HEAT SINKS

CROSS-REFERENCE TO RELATED APPLICATIONS

This application claims the priority under 35 U.S.C. §119 of European patent application no. 13191736.1, filed on Nov. 6, 2013, the contents of which are incorporated by reference herein.

FIELD

The present invention relates to a semiconductor device comprising a heat sink array. In particular it relates to a silicon-on-insulator (SOI) device high power device comprising such a heat sink array.

BACKGROUND

In semiconductor devices, a heat sink is a passive component that may be arranged to cool the device by dissipating heat away from an active area of the device, such as a p-n junction interface. Heat sinks may commonly be used whenever the inherent heat dissipation ability of the basic semiconductor device is insufficient to control its temperature during operation. This inherent inability to dissipate heat may be present in high-power semiconductor devices such as for example a power transistor manufactured by SOI technology.

SOI technology makes use of a layer of silicon, followed by a layer of insulator material formed on a silicon substrate, in place of conventional silicon substrates used in semiconductor manufacturing, so as to improve device performance. When used in power transistor devices, SOI technology has significant advantages over bulk silicon devices, for example: small area trench isolation; low junction leakage currents; fast reverse recovery behaviour by reducing parasitic device capacitance; increased robustness and the ability to integrate with thyristors and insulated gate bipolar transistors.

Figure 1A:
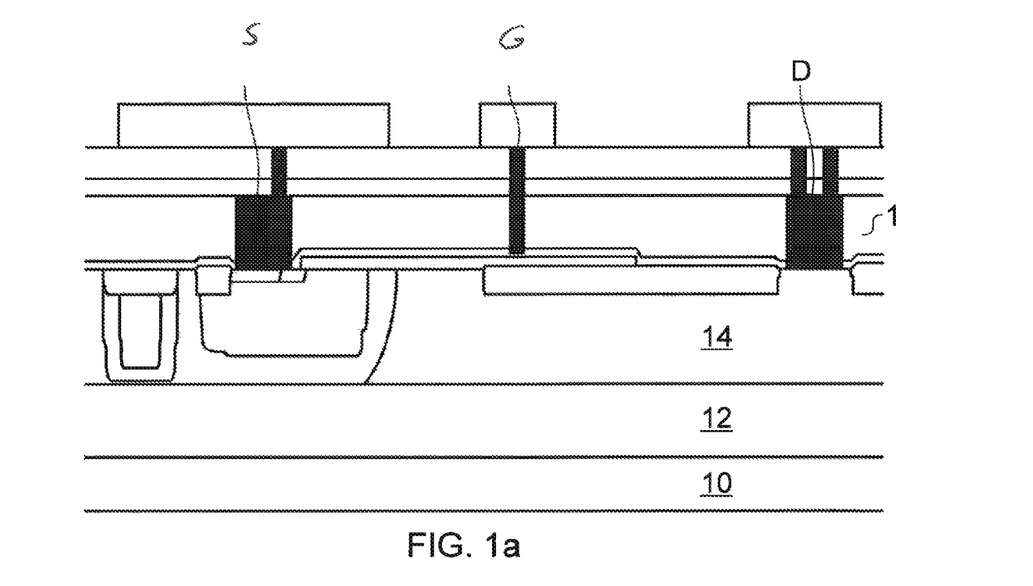
FIG. 1a is a cross-sectional schematic of a typical individual SOI device.

A typical individual SOI transistor device 1 is shown in FIG. 1a. In general, such a device may comprise a silicon substrate 10 typically of n-type conductivity, however p-type conductivity silicon substrates are also possible, followed by a oxide layer 12. The oxide layer, known as a buried oxide (or BOX) may be any suitable oxide layer such as silicon dioxide ($SiO_2$). The BOX 12 layer is followed by an SOI layer 14 onto which gate G, source S and drain D contacts are fabricated. Fabrication of such device structures may be achieved by way of the so-called SIMOX process or alternatively by wafer bonding processes.

Figure 1B:
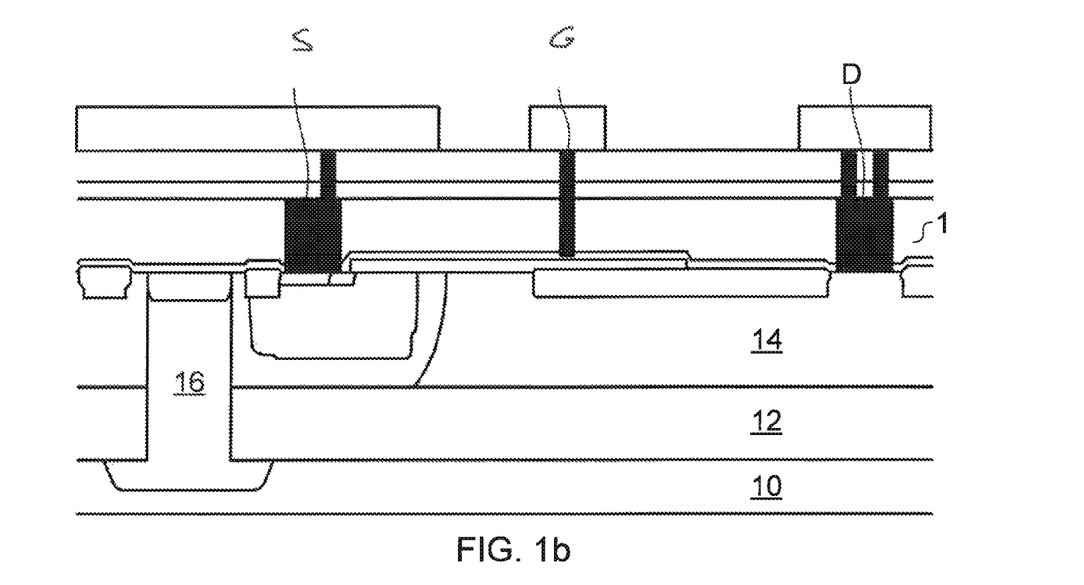
FIG. 1b is a cross-sectional schematic of a of an individual SOI device with an integrated heat sink.
Figure 2A:
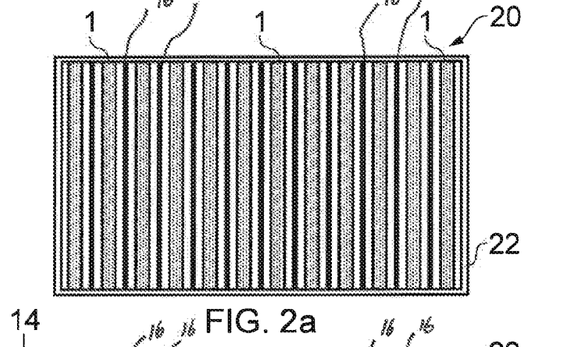
FIG. 2a is a schematic plan view of a typical high power SOI device, formed of multiple individual SOI devices, of the type illustrated in FIG. 1b.
Figures 2B, 3A:
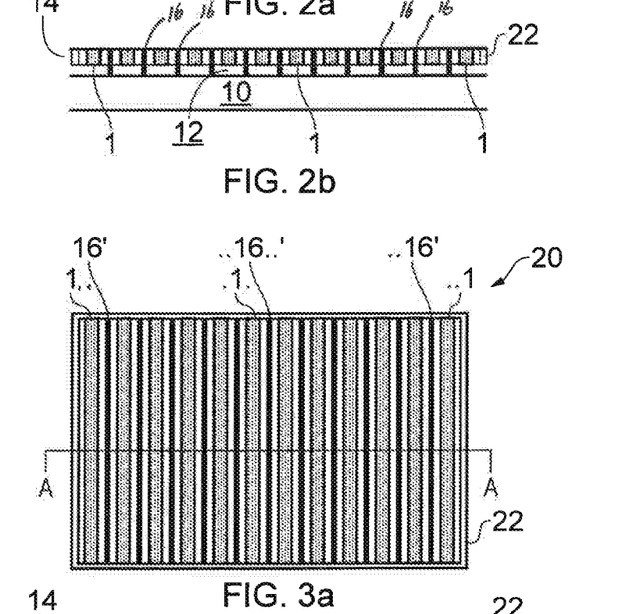
FIG. 2b is a schematic cross-sectional view of a typical high power SOI device, formed of multiple individual SOI devices, of the type illustrated in FIG. 1b.
FIG. 3a is a schematic plan view of a high power SOI device according to an embodiment.

A high power SOI device 20 as shown in FIGS. 2a and 2b, may typically be formed of an array of pairs of individual SOI transistor devices 1 (of the type illustrated in FIG. 1a or in FIG. 1b discussed further below).

Figure 2C:
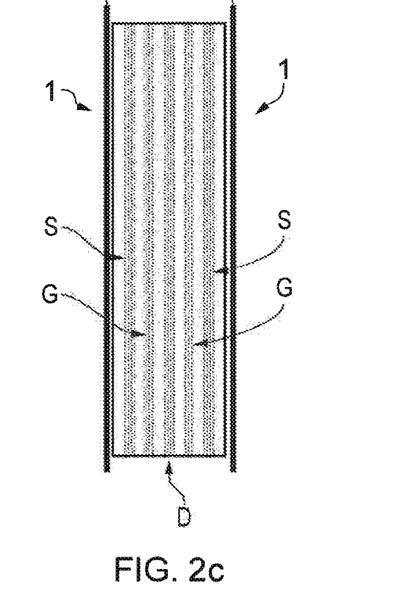
FIG. 2c is an exploded schematic plan view of a pair of individual SOI devices, of the type illustrated in FIG. 1b.

Pairs of individual SOI transistor devices 1 may be arranged as illustrated in FIG. 2c. The pairs of individual SOI devices 1 share a common drain terminal D, with each individual SOI device 1 having its own source S and gate G terminals. In this arrangement the source S and gate G terminals are symmetric about the drain terminal D. For example using the nomenclature of the gate G, source S and drain D reference numerals, this would follow the order S-G-D-G-S.

Typically, there may be a heat sink 16 integrated into the SOI transistor device 1 as shown in FIG. 1b. The heat sink 16 is typically arranged to transfer heat from the active area of the device 1 to the substrate 10. The heat sink may extend from the active region adjacent the source S, through both the SOI layer 14 and the BOX layer 12 to the substrate 10. Typically for every source terminal S (or gate terminal G) there will be a corresponding heat sink 16, as illustrated in FIG. 2c.

The heat sink may be formed of any appropriate material such as polysilicon, silicon or metal or any suitable material having a lower conductivity than the BOX layer 12. The heat sink may be substantially cuboid rectangular in shape.

In the high power SOI device 20, each individual SOI transistor device 1 is known as a so-called "unit cell" of the high power SOI device 20. As shown in the cross-sectional view of FIG. 2b, the high power device 20 may be formed on a single substrate 10, such as silicon, with a single BOX layer 12 formed on, in the case of wafer bonding, or in the case of SIMOX, in the substrate 10. In this way, the substrate 10 and the BOX layer 12 are common to all individual unit cell SOI transistor devices 1.

As shown in the plan view of FIG. 2a, the high power SOI device 20 also includes an isolation ring 22 extending around the periphery of the high power SOI device 20. Isolation rings are typical for high voltage, high power devices and may be formed as ring of oxide around the device active area to prevent high voltages applied on the device from damaging other low voltage components which may be connected to it. It should be noted, for clarity purposes the heat sinks 16 illustrated in FIGS. 2a and 2b, whilst shown as single heat sinks 16 are pairs of heat sinks, each heat sink 16 of the pair corresponding to an individual unit cell SOI transistor devices 1.

In generally, problems surrounding poor heat dissipation in high power SOI devices may be more significant than in bulk silicon devices having a BOX layer, because the BOX layer may have a lower thermal conductance, typically only 1% of the thermal conductance of that of comparable bulk silicon devices.

Figure 5A:
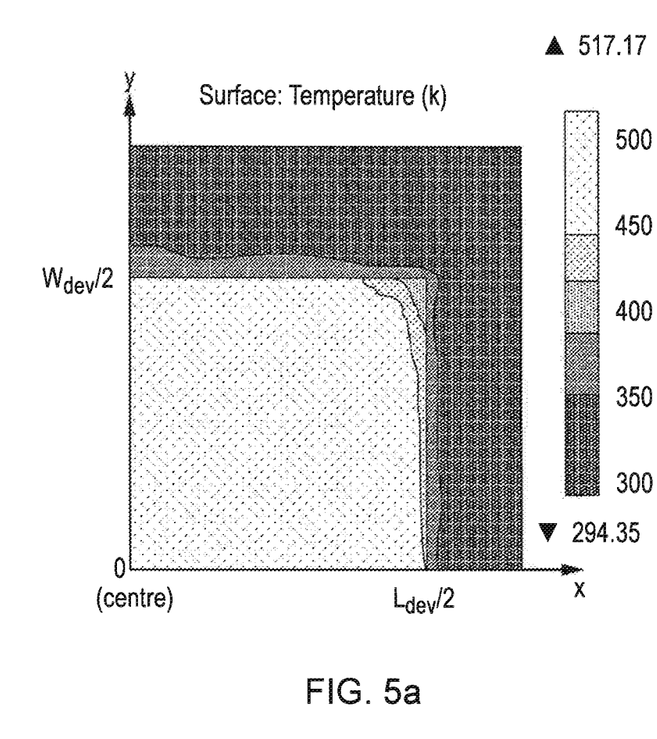
FIG. 5a is a simulated two-dimensional device surface temperature map for a SOI device according to the prior art.

FIG. 5a shows two-dimensional device surface temperature simulations (where the temperature is shown in Kelvin) of a typical high power SOI device of the type shown in FIGS. 2a to 2c. The temperatures are taken from the centre (shown as the origin of the x-axis ($L_{dev}/2$) and the y-axis ($W_{dev}/2$)) to respective adjacent edges of the high power SOI device 20 operating at a power of 5.2 watts. As can be seen from FIG. 5b, which shows a one dimensional temperature profile along the x-axis, the temperature peaks to a maximum at the centre of the high power SOI device and then falls away for each SOI device 1 from the centre taken along the x axis towards the edge (that is, the isolation ring 22) of the high power SOI device 20.

Simulations show that during operation, the high power SOI device 20 may exhibit a non-uniform temperature distribution for different unit cells or different regions of unit cells making up the high power SOI device 20. Looking at FIGS. 5a and 5b, due to heat dissipation issues mentioned above, the highest operating temperature peak is concentrated at the central region of the high power SOI device 20 gradually reducing to lower operating temperature at the edge of the high power SOI device 20. This temperature peak is due to the inability to dissipate heat from the central area of the device due to the conductance issues associated with SOI devices having BOX layers.

The temperature peak (also called a hot spot) which may be generated in the centre of the high power SOI device 20 during operation is the weakest point for device reliability which can result in breakdown of one or more SOI devices 1 at or near the hot spot. The result of device breakdown is that the SOI power device 20 may fail completely, or alternatively breakdown of an individual SOI device may reduce the functionality of the overall high power SOI device.

Referring again to FIG. 1b and FIGS. 2a and 2b, it is known to integrate a heat sink 16 into an SOI device 1. The heat sink 16 acts to conduct heat from the SOI layer 14 through the BOX layer 12 to the substrate. Such an SOI device 1 comprising such a heat sink 16 may form part of the larger scale high power SOI device 20 of the type discussed above (and illustrated in FIGS. 2a and 2b). However, adding heat sinks 16 for each individual SOI device 1 making up the high power SOI device 20 in this way may also consume a large amount of device area and the larger the device area the higher the on-state resistance (Rdson) of the high power SOI device 20 will be.

The present invention seeks to provide a semiconductor device which mitigates or overcomes at least one of the above mentioned problems.

SUMMARY

The invention is as set out in the claims.

The arrangement of heat sinks may result in a substantially even distribution of temperature across the semiconductor device during operation. As a result the semiconductor device may distribute the power more evenly so that each SOI device functions the same, which may which may result in improved functionality of the semiconductor device in a larger circuit.

The arrangement may also ensure that no SOI device has a temperature higher than the breakdown temperature.

Compared with the devices having no heat sinks as well those as having uniform heat sinks, smaller heat sinks may be at the edge of the semiconductor device. This has the benefit that the area saved can be used for the SOI devices, rather than heat sinks, and hence results in a lower Rdson.

DESCRIPTION OF THE DRAWINGS

In the foregoing and following discussion like reference numerals refer to like features. The invention will now described further hereinafter by way of example only with reference to the accompanying drawings in which.

Figure 3B:
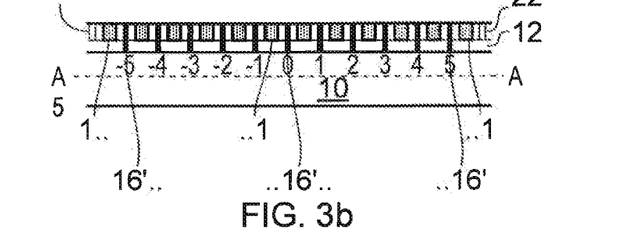
FIG. 3b is a schematic cross-sectional of a high power SOI device according to an embodiment.

FIGS. 3a and 3b illustrate schematic views of a high power SOI device 20 formed of multiple unit cell SOI devices 1. In FIG. 3a, which is a plan view the of the high power SOI device 20, the SOI devices 1 (here arranged as pairs as discussed above) are arranged as a regular n×m array, where n is the number of rows of the array, and m is the number of columns in the array. The SOI devices may be formed as semiconductor device dies, typically as SOI MOS devices, where each of the device dies of the array shares a substrate 10, an SOI layer 14 and a BOX layer 12.

The skilled person will understand that the number of rows n and the number of columns m of the array may be any positive integer as required by the particular application of the device. In this context the skilled person will also understand that the term "regular" array refers to the situation where the number of SOI devices 1 in all rows n of the array may be the same and that the number of SOI devices 1 in all columns m of the array may be the same. FIG. 3b shows a cross-section of the SOI device 20 array taken through line A-A of Figure and shows the SOI MOS devices 1 corresponding to the number of columns n formed on the BOX layer and the substrate. This arrangement of layers is discussed in more detail below. The number of rows n in the array may, or may not, be equal to the number of columns m in the array. In the example the array is a 1×24 array, that is, there is one SOI device per column m, and twenty four SOI devices 1 per row.

A heat sink element 16' may be integrated with each, or some of the SOI devices 1. Integration of a heat sink element 16' with an SOI device 1 is discussed in more detail below. Heat sink elements 16' may be omitted from the SOI devices 1 at the edge of the high power SOI device 20 as those edge SOI devices will be less prone to heating than centrally arranged SOI devices. This may be due to improved heat dissipation effects at the edge of the high power SOI device 20.

With reference to FIG. 3a the width of an inner heat sink element 16' associated with the central, or inner SOI device 1 is designated $W_{hs\_0}$. The width of subsequent, or outer heat sink elements 16' associated with subsequent, or outer SOI devices 1 are generally designated $W_{hs\_0+m}$, where m is column integer of the array integer corresponding to a particular SOI device 1. In particular, $W_{hs\_1}$ and $W_{hs\_-1}$ may designate the widths of the heat sink elements 16' adjacent to the central SOI device 1 (or devices) of the high power SOI device 20.

The width of the heat sink element 16' $W_{hs\_0}$ associated with the central SOI device 1 may be greater than the width of each of the heat sink elements 16' associated with the each of the subsequent SOI devices 1 away from the centre, forming the high power SOI device 20.

Starting with the central heat sink element 16' the widths of the subsequent heat sink elements 16' may gradually and incrementally reduce to the smallest width at the edge of the SOI device 20 (or as discussed above at the SOI devices adjacent the edges of the SOI device 20). Therefore, the widths of the heat sink elements 16' may fulfil the requirement:

$$W_{hs\_0} > W_{hs\_0+1} \ldots W_{hs\_0+m} \text{ and}$$

$$W_{hs\_0} > W_{hs\_0-1} \ldots W_{hs\_0-m}$$

where m is the column integer associated with the SOI device 1 at (or adjacent to) the edge of the device.

Thermal conductance is defined as the quantity of heat that passes in unit time through a plate of particular area and thickness when the plates opposite faces differ in temperature by one Kelvin. Thermal conductance is given by the expression:

$$kA/L \quad \text{Eqn. 1}$$

Where k is the thermal conductivity of the material of the heat sink,

A is the area and L is the depth of the material.

From Eqn. 1 above, the skilled person will appreciate that the thermal conductance of any heat sink is therefore dependent on the volume (area×depth, where are is given as width time breadth) of the material, assuming that the thermal conductivity of the material k, remains constant. Therefore, as a result of a variation in width of the heat sink, which the skilled person will understand will vary the volume of the heat sink (all other dimensions being constant), from the centre to the edge of high power SOI device 20, the thermal conductance of each heat sink element 16' will also vary.

This variation in thermal conductance between heat sink elements 16' has the result that during operation of the SOI device 20 the heat generated in the central SOI devices 1 of the high power device 20 will be reduced more efficiently than at the edge devices, so that more uniform temperature peaks across all of the SOI devices 1 can be achieved. In other words, the temperature may be substantially constant across the array of SOI devices 1 forming the high power SOI device 20.

The width of heat sinks 16 in the central region of the high power SOI device 20 may be in the region of 2 to 3 μm where the width of successive heat sinks may reduce by a factor of 0.8 from the central region of the high power SOI device 20 to the edge region. Of course, the skilled person will understand that there will be a minimum limit on the width of the heat sink this limit may be determined by any lithography process used. For example in CMOS Typically, the depth of the heat sinks 16 may be 2.5 μm. However, any appropriate depth may be used where the depth is dependent on the thickness of the SOI layers 14 and BOX layers 12 used in any particular device provided that the heat sink extends from the top of the SOI layer 14 through the BOX layer 12 to the substrate.

Alternately, in an embodiment and based on the general principles disclosed above the skilled person will appreciate that the volume of the heat sink elements, and thus the thermal conductance of the heat sinks may be varied by changing the depth of the heat sink elements. Therefore, starting with the central heat sink element the volume of the subsequent heat sink elements will incrementally reduce to the smallest volume at the edge of the SOI device 20. Therefore, the volume of the heat sink devices $V_{hs\_0}$ fulfil the requirement:

$$V_{hs\_0} > V_{hs\_0+1} \ldots V_{hs\_0+m} \text{ and}$$

$$V_{hs\_0} > V_{hs\_0-1} \ldots V_{hs\_0-m}$$

where m is the column integer associated with the SOI device 1 at the edge of the device.

To vary the volume of each of the heat sink elements the area of the window for the heat sink element on the mask design may be changed as would be understood by the skilled person.

Figure 4A:
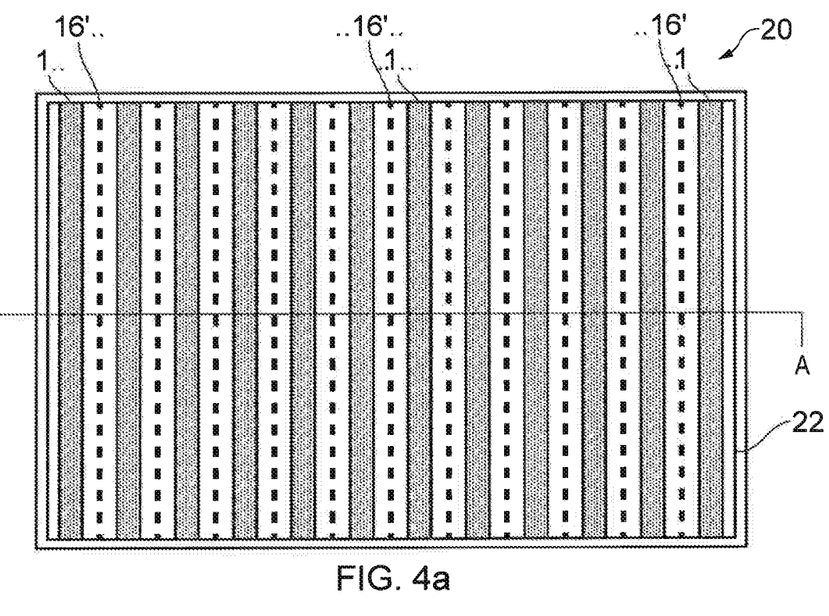
FIG. 4a is a schematic plan view of a high power SOI device according to an embodiment.
Figure 4B:
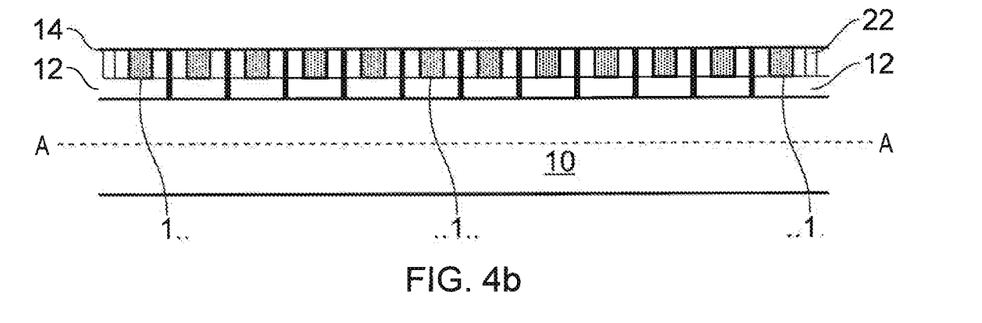
FIG. 4b is a schematic cross-sectional of a high power SOI device according to an embodiment.

In an embodiment as shown in FIGS. 4a and 4b, rather than providing single heat sink elements 16' for each SOI device 1, the heat sinks 16' may sub-divided into smaller heat sinks, known as plugs. In this case the density of the plugs, that is the distance between each of the plugs may increase from the centre towards the edge of the SOI device 1. In other words, the spacing between adjacent plugs is smaller at the centre of the SOI device 1 than the spacing between adjacent plugs moving away from the centre of the SOI device 1.

The skilled person will understand therefore that the distance between two adjacent plugs in a column m will decrease from the edge for towards the centre of the high power SOI device 20.

The distance between two adjacent plugs may follow a geometric series. From the centre to the edge the distance between adjacent plugs increases by a factor of 0.8 from one plug to its adjacent plug in a column M. This ratio is may be dependent on the size of the device and also the required operation of the high power device SOI. Such an arrangement allows for ease of manufacture because the mask windows dimensions used to define the plug may be fixed for each SOI device 1. In other words the window dimensions of the mask used for form the heat sinks 16' will be fixed, but the distance between windows will vary dependent on the required density.

In embodiments, an isolation ring is provided around the periphery of the SOI device 20. The isolation ring is typically formed as a ring of oxide to prevent high voltage applied the device from damaging other low voltage components connected to it.

Whilst the skilled person will appreciate regular n×m arrays are preferred so as to maximise area layout for high power SOI devices 20, the skilled person will also appreciate that the principles described above may also be applied to irregular arrays, in the form of circular, triangular, or any other layout of SOI devices 1.

Figure 5B:
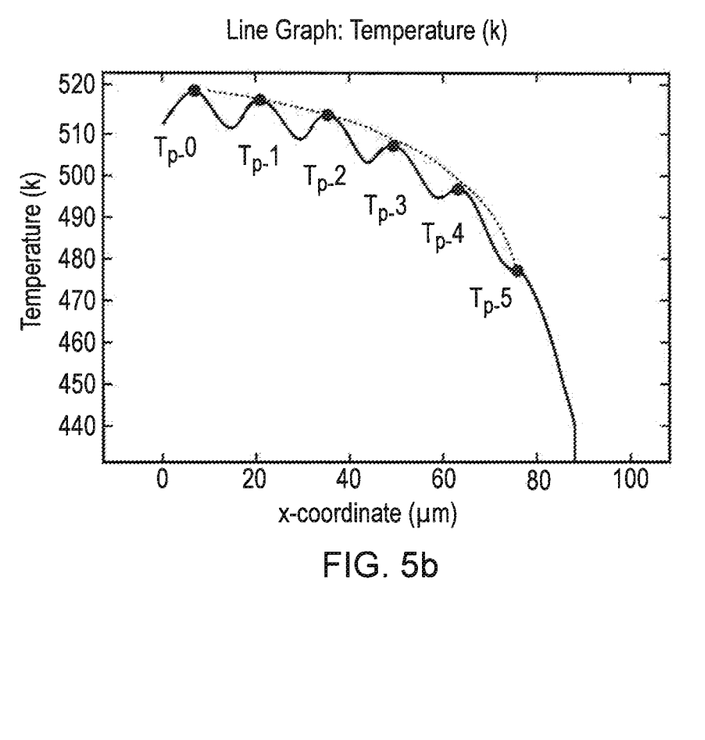
FIG. 5b is a plot of temperature versus distance from the centre to edges of an SOI device according to the prior art.
Figure 6A:
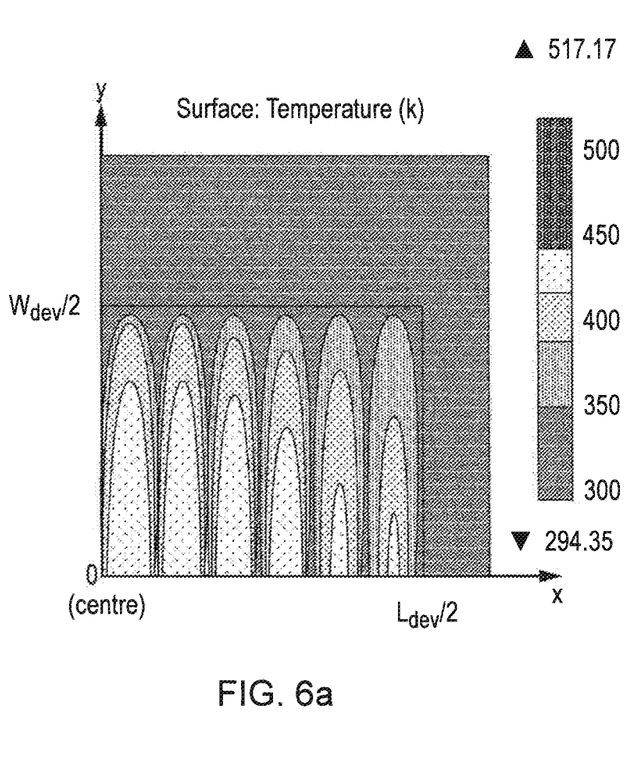
FIG. 6a is a simulated two-dimensional device surface temperature map for a SOI device according to an embodiment.
Figure 6B:
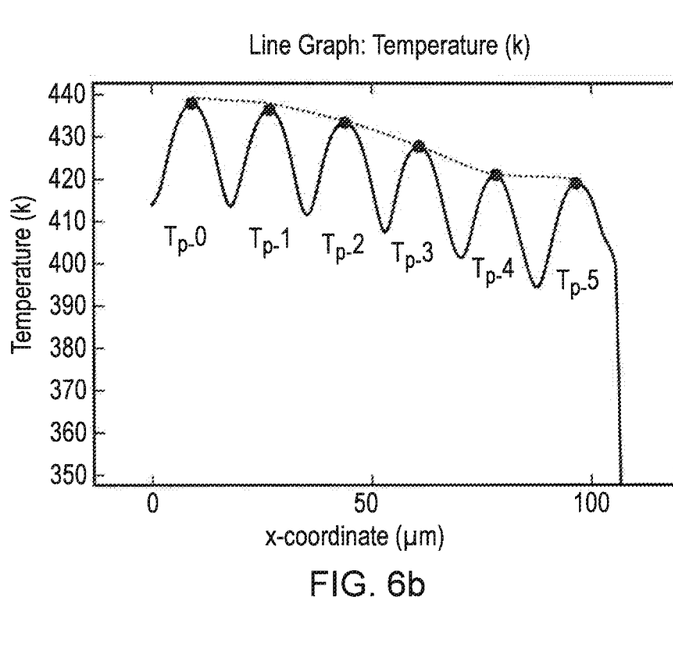
FIG. 6b is a plot of temperature versus distance from the centre to edges of an SOI device according to an embodiment.
Figure 7A:
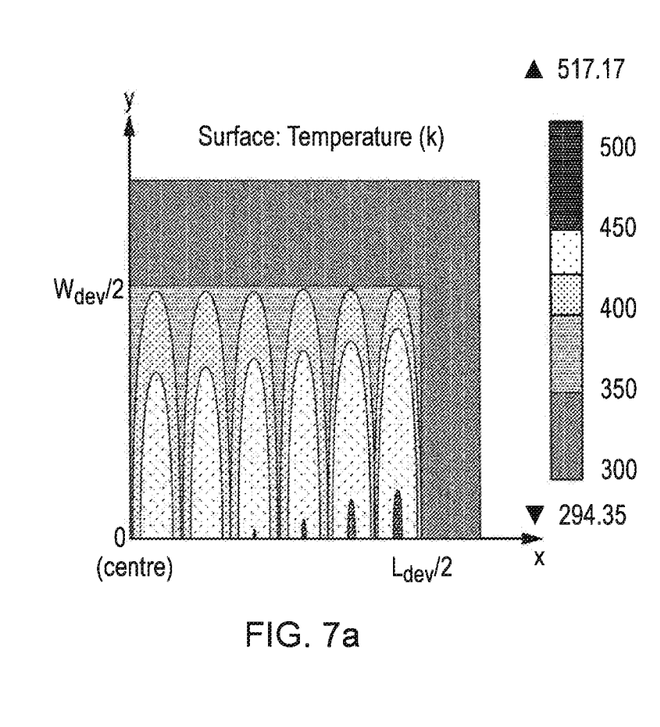
FIG. 7a is a simulated two-dimensional device surface temperature map for a SOI device according to an embodiment.

FIGS. 5a, 6a and 7a show simulated two-dimensional (2D) device surface temperature maps in Kelvin for the high power SOI device 20 operating at a power of 5.2 watts. In those figures the x and y-axis correspond to the lengths from the centre to respective top and side edges of the high power SOI device 20. In overview, FIGS. 5b, 6b and 7b show plots of temperature versus distance from the centre to edges of high power SOI devices 20.

FIGS. 5a and 5b illustrate the device temperature for a prior art device of the type discussed above. The operating temperature for each of the prior art SOI devices 1 is in the range 517K for the centre device to 470K for an edge device. From this it is evident that for a prior art high power SOI device 20 heat is not evenly distributed across each of the SOI devices 1 and that a hot spot, which can result in device failure, occurs at the central devices.

FIGS. 6a and 6b illustrate the device temperatures for a high power SOI device 20 according to embodiments discussed above. In comparison to the prior art device, the operating temperature for each of the SOI devices 1 is lower and substantially constant in the range 420K to 440K from the centre SOI devices 1 to the edge SOI devices 1. From this it is evident that heat generated during operation of the device is evenly distributed across each of the devices and that hot spots do not occur, as opposed to the prior art.

Figure 7B:
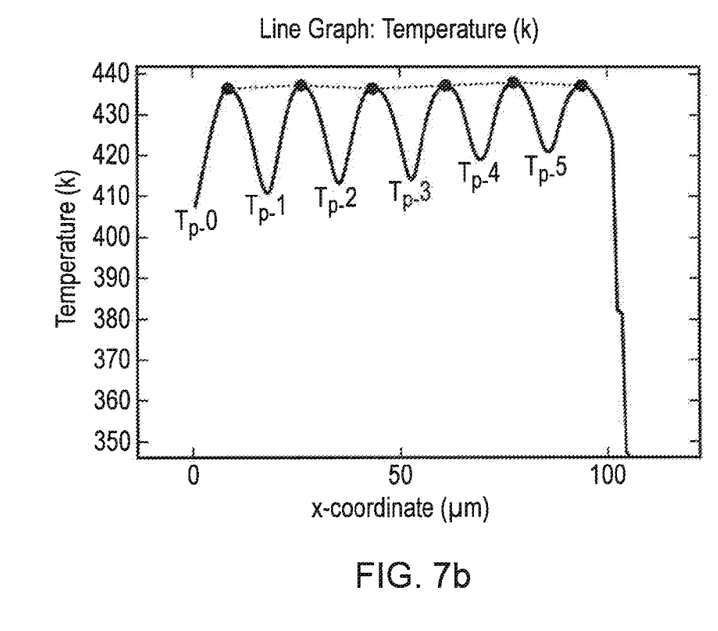
FIG. 7b is a plot of temperature versus distance from the centre to edges of an SOI device according to an embodiment.

FIGS. 7a and 7b illustrate the device temperatures for device according to embodiments discussed above. In comparison to the prior art device, the operating temperature for each of the SOI MOS devices 1 is lower and substantially constant at 438K from the centre SOI devices 1 to the edge SOI devices 1. From this it is evident that heat generated during operation of the device is evenly distributed across each of the devices and that a hot spots do not occur, as opposed to the prior art.

According to the embodiments, the heat sink 16 is processed in the SOI device 1 by known techniques. A trench, corresponding in dimensions those of the heat sink, is etched through the SOI layer 14 and the BOX layer 12 to the substrate 10. The trench is then filled with a polysilicon heat sink material and the SOI device 1 structure such as the gate G, source S and drain D are then formed. To avoid negative effects on SOI device 1 characteristics such as junction leakage current and parasitic device capacitance the trenches are located near the source terminal which is grounded by arranging the heat sink on the same side of the SOI device as the source S contact.

By providing the heat sinks as described, the heat sinks are optimised for such that that they sacrifices less area on the high power SOI device 20 whilst maintaining adequate heat dissipation purpose. As a consequence the high power SOI device 20 lower will have a lower Rdson.

The embodiments presented herein can be implemented, either alone or in combination in for example, automotive applications such as relay driver applications, or as the skilled person will appreciate any other type of power driver in which the non-uniform rise of the temperature in the device is a concern for device reliability.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A semiconductor device comprising a heat sink array, the heat sink array comprising: one or more inner heat sink elements; and one or more outer heat sink elements, said inner heat sink elements and said outer heat sink elements each having a thermal conductance, wherein the thermal conductance of at least one of said inner heat sink elements is greater than the thermal conductance of said outer heat sink elements, wherein each of said inner heat sink elements and said outer heat sink elements comprises separated heat sink plugs, wherein spacing between adjacent heat sink plugs at the center of the semiconductor device is smaller than spacing between adjacent heat sink plugs moving away from the center of the semiconductor device, and wherein said inner heat sink elements and said outer heat sink elements having different volumes.

2. The semiconductor device of claim 1, said inner heat sink elements having a first volume and said outer heat sink elements having a second volume, wherein the first volume is greater than the second volume.

3. The semiconductor device of claim 2, said inner heat sink elements having a first cross-sectional area and said outer heat sink elements having a second cross-sectional area, wherein the first cross-sectional area is greater than the second cross-sectional area.

4. The semiconductor device of claim 1, a plurality of said inner heat sink elements having a first density and a plurality of said outer heat sink elements having a second density, wherein the first density is greater than the second density.

5. The semiconductor device of claim 1, further comprising intermediate heat sink elements disposed between the inner heat sink elements and said outer heat sink elements, and having a thermal conductance intermediate that of said inner heat sink elements and said outer heat sink elements.

6. The semiconductor device of claim 1, wherein each of the heat sink elements is disposed on a corresponding semiconductor die.

7. The semiconductor device of claim 6, wherein the semiconductor dies are arranged as an array.

8. The semiconductor device of claim 7, wherein the semiconductor dies are silicon on insulator structures.

9. The semiconductor device of claim 8, wherein the semiconductor dies are MOSFETs.

10. The semiconductor device of any of claim 7, wherein each of the semiconductor dies arranged as an array share a common substrate.

11. The semiconductor device of claim 1, wherein the heat sink array and an array of semiconductor dies are arrays where the number of silicon on insulator structures in all rows of the arrays is the same and where the number of silicon on insulator structures in all columns of the arrays is the same.

12. The semiconductor device of claim 11, wherein the arrays comprise an n×m array, where n and m are positive integers.

13. The semiconductor device of claim 1, wherein the heat sink array and an array of semiconductor dies are triangular arrays.

14. The semiconductor device of claim 1, further comprising an isolation ring is provided around the periphery of said device.

15. A semiconductor device comprising a heat sink array, the heat sink array comprising: one or more inner heat sink elements; and one or more outer heat sink elements, said inner heat sink elements and said outer heat sink elements each having a thermal conductance, wherein the thermal conductance of at least one of said inner heat sink elements is greater than the thermal conductance of said outer heat sink elements, wherein each of said inner heat sink elements and said outer heat sink elements comprises separated heat sink plugs, wherein spacing between adjacent heat sink plugs at the center of the semiconductor device is smaller than spacing between adjacent heat sink plugs moving away from the center of the semiconductor device, and wherein each of the heat sink elements is disposed on a corresponding semiconductor die.

\* \* \* \* \*